(12) United States Patent
Fehkuhrer

(10) Patent No.: US 10,475,672 B2
(45) Date of Patent: Nov. 12, 2019

(54) DEVICE AND METHOD FOR AT LEAST PARTLY DISSOLVING A CONNECTING LAYER OF A TEMPORARILY BONDED SUBSTRATE STACK

(71) Applicant: EV Group E. Thallner GmbH, St. Florian am Inn (AT)

(72) Inventor: Andreas Fehkuhrer, Senftenbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 12 days.

(21) Appl. No.: 15/546,679

(22) PCT Filed: Nov. 3, 2015

(86) PCT No.: PCT/EP2015/075585
§ 371 (c)(1),
(2) Date: Jul. 27, 2017

(87) PCT Pub. No.: WO2016/128079
PCT Pub. Date: Aug. 18, 2016

(65) Prior Publication Data
US 2018/0040489 A1    Feb. 8, 2018

(30) Foreign Application Priority Data
Feb. 10, 2015    (DE) .................. 10 2015 101 897

(51) Int. Cl.
*B32B 43/00*    (2006.01)
*H01L 21/67*    (2006.01)
(Continued)

(52) U.S. Cl.
CPC ........ *H01L 21/67051* (2013.01); *B26F 3/004* (2013.01); *B32B 43/006* (2013.01);
(Continued)

(58) Field of Classification Search
CPC ............ B32B 43/006; Y10T 156/1111; Y10T 156/1116; Y10T 156/1933;
(Continued)

(56) References Cited

U.S. PATENT DOCUMENTS 3,407,099 A * 10/1968 Schell ................ B05B 13/0207
134/199
4,509,545 A * 4/1985 Trotter .................... A47J 43/24
134/199
(Continued)

FOREIGN PATENT DOCUMENTS

KR    100791995 B1    12/2007    ......... H01L 21/205
KR    100791995 B1    12/2007
WO    WO-2013162266 A1 *  10/2013    ........ B05B 13/0436

OTHER PUBLICATIONS

International Search Report from corresponding International Patent Application No. PCT/EP2015/075585, dated Nov. 2, 2016.

*Primary Examiner* — Mark A Osele
(74) *Attorney, Agent, or Firm* — Kusner & Jaffe

(57) ABSTRACT

A device and method for at least partial loosening of a connecting layer of a temporarily bonded substrate stack. The device has at least one ring, whereby the substrate stack can be placed within the at least one ring, the at least one ring having a plurality of nozzles. The nozzles are arranged distributed at least over a portion of the periphery of the at least one ring, the nozzles directed onto the connecting layer. The device sprays solvent from the nozzles onto an edge area of the connecting layer.

19 Claims, 5 Drawing Sheets

(51) Int. Cl.
*H01L 21/683* (2006.01)
*B26F 3/00* (2006.01)
*H01L 21/677* (2006.01)
*B05B 1/20* (2006.01)

(52) U.S. Cl.
CPC .. *H01L 21/67092* (2013.01); *H01L 21/67757* (2013.01); *H01L 21/6836* (2013.01); *B05B 1/207* (2013.01); *H01L 2221/68327* (2013.01); *H01L 2221/68381* (2013.01); *Y10S 156/93* (2013.01); *Y10S 156/941* (2013.01); *Y10T 156/1111* (2015.01); *Y10T 156/1933* (2015.01)

(58) Field of Classification Search
CPC ............ Y10T 156/1939; Y10S 156/93; Y10S 156/941; B26F 3/004; B05B 1/06; B05B 1/207; B08B 3/024; H01L 2221/68381
See application file for complete search history.

(56) References Cited

U.S. PATENT DOCUMENTS

| | | | |
|---|---|---|---|
| 6,033,974 A | 3/2000 | Henley et al. | 438/526 |
| 6,382,292 B1* | 5/2002 | Ohmi | H01L 21/67092 156/239 |
| 9,927,185 B1* | 3/2018 | Boyd, IV | F28F 1/003 |
| 2002/0011259 A1* | 1/2002 | Pociask | B08B 3/026 134/34 |
| 2002/0029849 A1 | 3/2002 | Ohmi et al. | 156/344 |
| 2003/0003687 A1 | 1/2003 | Yanagita et al. | 438/458 |
| 2005/0009297 A1 | 1/2005 | Rayssae et al. | 438/455 |
| 2006/0174434 A1* | 8/2006 | Heumann | B08B 1/008 15/88 |
| 2006/0174920 A1* | 8/2006 | Randhawa | B05B 1/044 134/34 |
| 2008/0047589 A1 | 2/2008 | Huang et al. | 134/33 |
| 2008/0156041 A1* | 7/2008 | Cooper | C03C 25/146 65/463 |

* cited by examiner

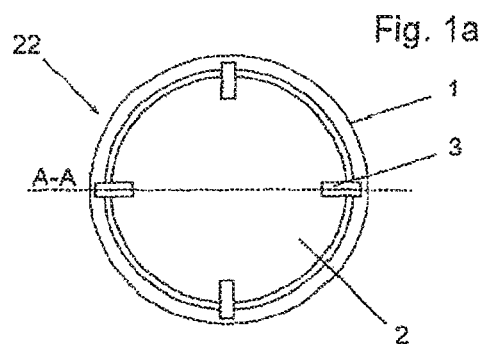
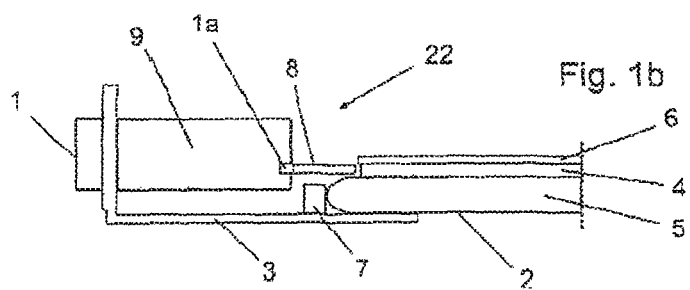
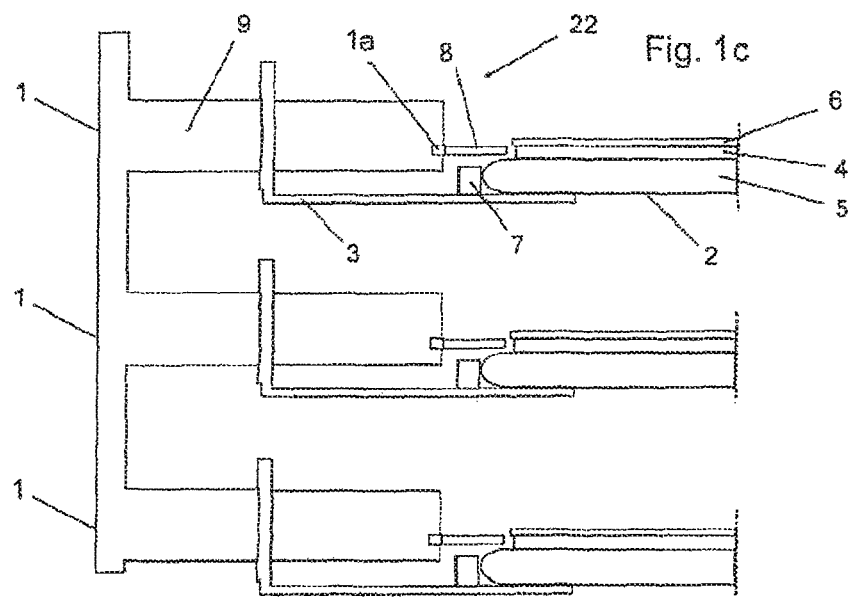

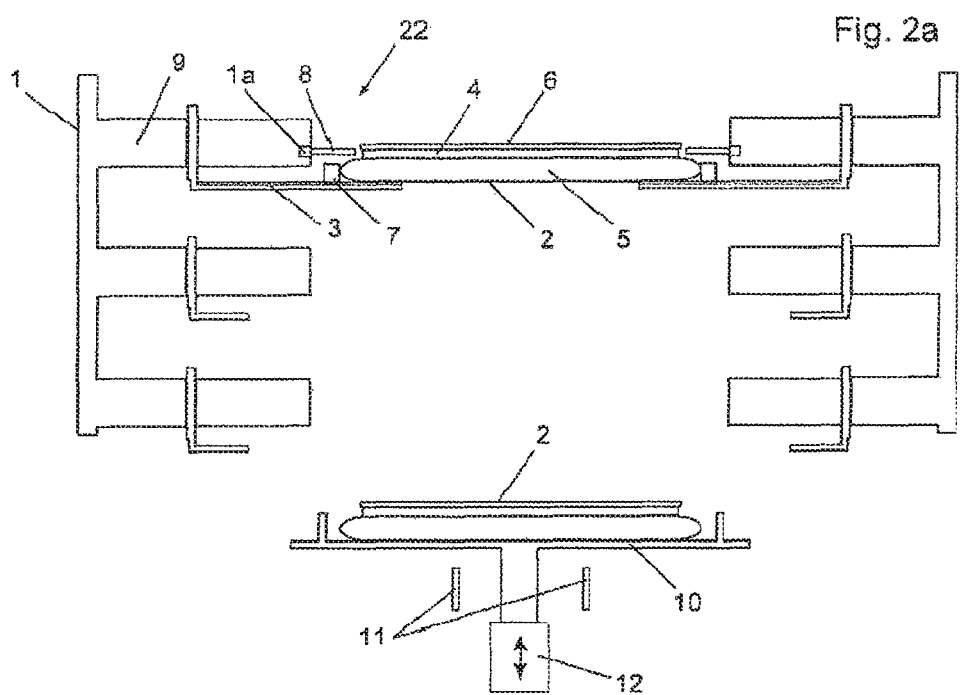
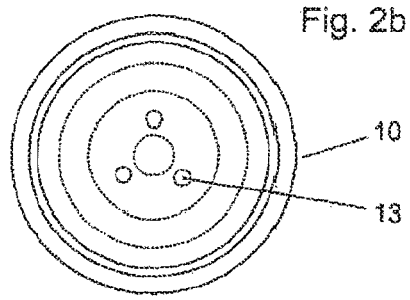

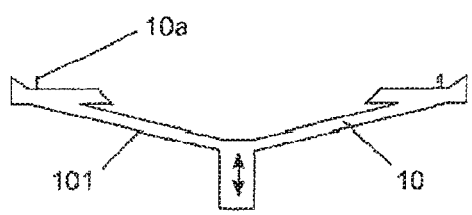
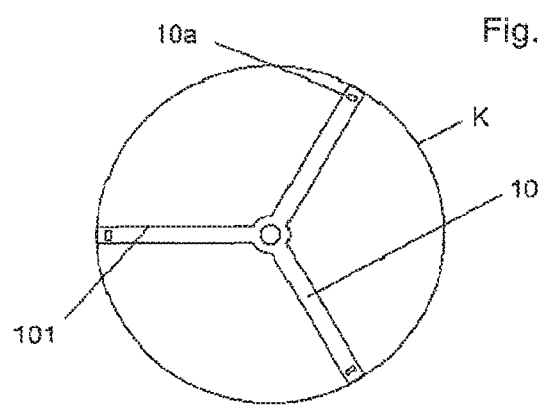

DEVICE AND METHOD FOR AT LEAST PARTLY DISSOLVING A CONNECTING LAYER OF A TEMPORARILY BONDED SUBSTRATE STACK

FIELD OF THE INVENTION

The present invention relates generally to a device and method for at least partial loosening of a connecting layer of a temporarily bonded substrate stack.

BACKGROUND OF THE INVENTION

The back-thinning of product substrates in the semiconductor industry is often necessary and can be carried out mechanically and/or chemically. For back-thinning, the product substrates are in general temporarily attached to a carrier.

Various methods for dissolving or destroying the connecting layer are known, such as, for example, the use of UV light, laser beams or action of temperature. Other approaches pursued separation by solvent.

Detaching is increasingly turning out to be one of the most critical process steps since the thin substrates with substrate thicknesses of a few μm easily break during detachment/removal or suffer damage because of the forces that are necessary for the detaching process.

Moreover, the thin substrates have very little if any dimensional stability and typically roll without support material. During handling of the back-thinned substrates, therefore, it is virtually indispensable to attach and support the substrates.

SUMMARY OF THE INVENTION

It is the object of this invention to make available an improved device or an improved method for at least partial loosening of a connecting layer of a temporarily bonded substrate stack.

This object is achieved with the device according to the invention or with the method according to the invention in accordance with the associated claims.

Advantageous further developments of the invention are indicated in the subclaims. All combinations that consist of at least two of the features indicated in the specification, the claims and/or the figures also fall within the framework of the invention. In the indicated ranges of values, values as boundary values that lie within the above-mentioned limits are also disclosed and can be claimed in any combination.

According to the invention, the device has at least one ring, whereby the substrate stack can be placed within the at least one ring, whereby the at least one ring has a number of nozzles, whereby the nozzles are arranged distributed at least over a portion of the periphery of the at least one ring, whereby the nozzles are directed to the connecting layer, and whereby the device is designed in such a way that solvent can be sprayed from the nozzles onto an edge area of the connecting layer.

Because of the nozzles being arranged in the shape of a ring, a uniform dissolving of at least a portion of the connecting layer is advantageously possible. As a result, it can be advantageously achieved that the separation of the substrate stack can be carried out in a relatively gentle and fast manner. Advantageously, the connecting layer is only partially or partly dissolved (i.e. loosened), i.e. only slightly dissolved (loosened), so that the substrate stack still remains tightly connected enough so that it can be fed to another processing station without being damaged. It can be achieved in particular that the connecting layer is merely partially dissolved in a first step and is completely dissolved only in a subsequent second step. As a result, the separation of the substrate stack can be carried out even more gently and even more quickly. In addition, the holding device of the substrate stack can be simplified, since only one side of the substrate stack has to be secured. Because of this simple holding device, the structure of the device can be considerably simplified, so that it is possible to process multiple substrate stacks at the same time. In addition, because of the simple structure of the holding device, cleaning of the substrate stack can also be carried out in the device.

In principle, however, it is also possible with this invention to completely dissolve the connecting layer in one work process and to completely separate the substrate stack.

The invention has in particular the following advantages:
Multiple substrate stacks can be processed at the same time
The processing times are reduced
No rotating parts are necessary
Comparatively simpler structure
Also, the substrate stack carriers or holding devices can be cleaned.

The device according to the invention and the method are suitable in particular for dissolving, in particular partially dissolving, substrate stacks, which are bonded only partially, preferably only peripherally, in their edge area. Especially preferably, the device according to the invention and the method according to the invention are used for partially dissolving two substrates, which were temporarily bonded with one another only in places, in particular with a Zone-Bond® process.

The substrate stack has at least two substrates, which are temporarily bonded with one another, at least in places, via the connecting layer. The two substrates can be a carrier, in particular a semiconductor wafer, and a product substrate, in particular a semiconductor wafer. The substrate stack can also be comprised of three or more substrates and/or of multiple layers, in particular a 3-wafer stack (triple stack).

The product substrate is in particular thinned to a thickness of between 0.5 μm and 250 μm. As a carrier, preferably a carrier substrate with a thickness of between 50 μm and 5,000 μm, especially preferably between 500 μm and 1,000 μm, is used.

The substrates can have any shape, in particular a round shape. The diameter of the substrates is in particular standardized industrially. For wafers, the industry-standard diameters are 1 inch, 2 inches, 3 inches, 4 inches, 5 inches, 6 inches, 8 inches, 12 inches and 18 inches.

For the connecting layer, a film or an adhesive, in particular a soluble adhesive, preferably a thermoplastic, is suitable, which adhesive is applied in particular selectively in an edge area of the carrier-substrate-product-substrate composite, preferably in an edge zone of 0.1 mm to 20.0 mm in width, especially preferably 0.1 to 10.0 mm, more preferably 0.1 to 5.0 mm, most preferably 0.1 to 2.0 mm, and with utmost preference 0.1 to 1.0 mm in width. As an alternative, the adhesive can be applied in particular over the entire surface, whereby the adhesive force can be reduced preferably in the center by an adhesion-reducing layer, in particular a fluoropolymer, preferably Teflon.

The in particular chemical partial dissolving of the connecting layer is especially gentle for the product substrate, and the partial dissolving can be carried out very quickly, in particular when only edge areas of the product substrate are provided with a connecting layer, so that the solvent can act quickly, in particular from the side. In a preferred embodiment according to the invention, a partial dissolving is achieved on the edge, so that the separation or the detaching can be performed quickly and without the action of stronger forces immediately afterward, in particular in a separate station. The complete detaching is done in particular by the combination of chemical loosening (dissolving) and mechanical action.

The device or the method can be designed in particular for partial dissolving, detaching, and/or cleaning of the substrate stack or of the product substrate. The device can be designed like a module and can be in particular part of an entire unit. The device can also, however, itself be an entire unit with multiple modules, for example a partial-dissolving module, a detaching module, and/or a cleaning module. The modules can be arranged in the shape of a cluster and/or star around a central module, in particular with a system of movement for the substrates or substrate stack (for example, a robotic system).

The invention is based in particular on the idea of partially dissolving the product substrate gently from the carrier substrate, specifically in particular for multiple substrate stacks at the same time, it is provided in particular that the partial dissolving of the connecting layer is carried out preferably in concentric strips, in particular circles, from the periphery of the connecting layer to the center of the connecting layer. The invention relates in particular to a device and a method for quick partial dissolving of multiple substrate stacks at the same time. The process time is reduced by the nozzles (nozzles also comprise slots and holes), which in particular spray directly on the connecting layer (or in the bond interface). In particular, in this process, the substrate stack is not rotated; in particular, the substrate stack remains motionless during the loosening of the connecting layer, A special advantage according to the invention is that continuously fresh or at least re-prepared solvent is used for loosening the connecting layer. Thus, anew device according to the invention for loosening the connecting layer is disclosed, which device is clearly distinguished from devices in which the substrate stack is completely surrounded by solvent, which is contaminated over time by the components of the connecting layer.

According to the invention, the device has at least one ring. The at least one ring is mounted preferably 0.1 to 15 mm, more preferably 0.1 to 10 mm, most preferably 0.1 to 8 mm, and with utmost preference 0.1 to 5 mm away from the substrate stack and/or the connecting layer. As a result, an especially efficient loosening or partial dissolving of the connecting layer is possible.

The at least one ring is equipped in particular with a solvent line that runs to a number of nozzles. The nozzles are preferably arranged distributed over the entire periphery, in particular evenly spaced from one another, of the at least one ring. As a result, an especially uniform loosening or partial dissolving of the connecting layer is advantageously possible.

The at least one ring preferably has at least 60, more preferably more than 70, more preferably more than 80, even more preferably more than 100, and quite especially preferably more than 120 nozzles, in particular on the entire periphery of the at least one ring.

It is preferably provided that the nozzles have a diameter of 0.01 to 10 mm, preferably 0.01 to 7 mm, more preferably 0.01 to 5 mm, and most preferably 0.1 to 2 mm. As a result, an especially efficient loosening or partial dissolving of the connecting layer is advantageously possible.

The cross-section and/or the shape of the nozzles can vary, and the nozzle flow is in particular dependent upon the design of the nozzles. A uniform, and in particular complete, spraying of the connecting layer can be achieved in particular by nozzles or nozzle holding devices that can pivot preferably in the horizontal plane. The degree of pivoting of the nozzles or of the nozzle holding devices is in particular 1° to 20°, preferably 1° to 15°.

In a special embodiment, the at least one ring has precisely one nozzle. As a result, the connecting layer is partially dissolved only in a locally limited manner. A uniform spraying of the connecting layer in the locally limited angular range of the nozzle can be achieved in particular by a nozzle or nozzle holding device that can pivot preferably in the horizontal plane. The spot that is thus partially dissolved is used as a scoring for the (i.e. mechanical) separation or for the detaching of the product substrate from the carrier substrate, in particular in a separate station.

The nozzles can be moved radially. In particular, the nozzles can be moved up to the periphery of the substrates, in particular the connecting layer, and can even contact the latter, if necessary. Contact is not desired, however, because of the risk of contamination of the nozzle by the components of the connecting layer. The maximum transverse path of a nozzle is in this case greater than 0 mm, preferably greater than 0.5 mm, even more preferably more than 1 mm, most preferably more than 5 mm, and all the more preferably more than 10 mm.

In order to hold the substrate stack in the (partial) dissolving position within the at least one ring, at least one ring is preferably equipped with at least one, in particular pivoting, holding device, in particular with at least one attaching pin for fastening the substrate stack. As a result, an improved fastening of the substrate stack is advantageously possible. In another exemplary embodiment, a vacuum system is arranged on the holding device.

Multiple rings, in particular with the corresponding holding devices, can be arranged in particular stacked, in particular vertically, one above the other and can be installed in particular in a closed chamber. The rings that are arranged one above the other are in particular connected to one another and are supplied, in particular by means of connecting lines or supply lines, with solvent, in particular by means of an in particular high-power circulating pump.

Preferably, 2 to 30 rings, more preferably 2 to 15 rings, most preferably 2 to 10 rings, and with utmost preference 2 to 5 rings can be arranged one above the other so that advantageously, multiple substrate stacks can be treated, in particular at the same time.

In particular because of the ring and the solvent line system (also called Common Rail System below), this invention makes possible a uniform spraying, in particular from the entire connecting layer periphery, without the substrate stack and/or the ring having to rotate. In an alternative embodiment, the ring or the rings and/or the holding devices are designed to move, in particular to rotate. For holding and transporting substrates, such as, e.g., wafers or substrate stacks, the latter are applied to a receiving system. As a receiving system, in particular a specimen holder (chuck) is suitable. In order to make possible a complete and/or faster loosening or partial dissolving, a rotation of the substrate and/or nozzle, i.e., ring, is performed. In this case, a relative rotation between the nozzles and the substrate stack is carried out. The substrate stack holder is preferably located on a shaft, which can be put into rotation around its axis, instead of rotation, an oscillation of the substrate stack holder around the shaft is also possible.

In this case, a rotation or oscillation can be set in such a way that at least the angle that lies between two nozzles is covered by the oscillation. As a result, the entire connecting layer periphery is covered, and fewer nozzles can be used.

Because of the device according to the invention and the method according to the invention, it is possible in particular to load multiple substrate stacks in succession into the rings of the device that are arranged one above the other, in particular stacked, in order to then loosen or at least partially dissolve the edge zones at the same time (e.g., in an Edge Zone Release Process Step).

The device especially preferably has a pivoting shield, so that when the loosening or partial dissolving is completed, and the lowermost substrate stack is removed for cleaning, the shield prevents the contamination of the lowermost substrate stack by drops from above. If the shield is pivoted, the substrate stack can be cleaned and then dried. To retrieve the next substrate stack, the shield comes up again. The shield is used as a drop-protective device or spray-protective device and is controlled manually, automatically, and/or semi-automatically. The shield can be moved from the pivoted, protective position into a starting position (not shown), e.g., by means of an actuator. The drops falling thereon are drained off, e.g., over an incline. The shield can have any shape, preferably round, rectangular, or square. The shield extends over the rings of the device or closes with a seal so that no contamination by drops from above can occur.

The device preferably has a receiving system that can move in particular in the vertical direction for receiving the substrate stack. The receiving system is used in the transport of the substrate stack. The receiving system transports the substrate stack to the ring and/or away from the ring. The receiving system is thus used for loading and/or unloading the ring. The substrate stack can advantageously be attached to the receiving system. As a receiving system, in particular a specimen holder (chuck) is suitable. The receiving system preferably brings individual substrate stacks into the (partial) dissolving position or (partial) dissolving positions. In an advantageous embodiment of the invention, it is provided that the receiving system or the device has loading pins that deposit the substrate stack on the holding device or receive it from the holding device.

Advantageously, it is preferably provided to extract from the device the lowermost substrate stack with the receiving system that is movable in particular in the z-direction and to cover it with the pivoting shield to the extent that cleaning and drying with solvent is possible. The device preferably has an in particular pivoting arm with at least one nozzle that can be used for cleaning the upper side of the substrate stack. The arm can be introduced in another embodiment as an arm with a hydraulically extensible telescopic boom in the in particular closed space above the substrate stacks.

Below and/or above the receiving system and/or in the lowermost and/or uppermost ring, there can be located at least one other nozzle, in particular a BSR (back-side rinse) nozzle, which points in particular in the direction toward the center of the substrate stack, so that even the lower side and/or the upper side of the substrate stack can be cleaned. It is especially advantageous when at least two solvent lines are present for the nozzle or nozzles. Arranged on the lower and/or upper side of the receiving system and/or in the lowermost and/or uppermost ring, preferably 1 to 60 nozzles, more preferably 1 to 10 nozzles, most preferably 1 to 6 nozzles, and with utmost preference 1 to 3 nozzles are installed. In another preferred embodiment, this nozzle or these nozzles can be moved, in particular from the center of the receiving system to the edge, whereby they preferably embody a uniform, in particular linear, movement. Other sequences of movement, such as, e.g., a spiral movement of the nozzle or nozzles, are possible. For good area coverage, a rotating and/or pivoting nozzle or nozzles can be used. Also, the substrate-holding devices themselves can be cleaned with these nozzles. The distance between the nozzles and the surface of a substrate can preferably also be set. The maximum transverse path of a nozzle is in this case greater than 0 mm, preferably greater than 1 mm, even more preferably more than 25 mm, most preferably more than 50 mm, and all the more preferably more than 100 mm.

The substrate stack is, in particular in the receiving system, during the cleaning, secured in particular on its periphery, preferably by 15, more preferably 9, most preferably 6, and with utmost preference 3 attaching pins. As a result, an especially efficient cleaning can advantageously be carried out. The receiving system is preferably configured in such a way that a robot can receive the substrate stack. In another embodiment according to the invention, no loading pins are used in the receiving system in order to keep the contamination as low as possible or to prevent it.

With this invention, according to a preferred embodiment, solvent that accumulates in a cleaning process is no longer disposed of but rather is separated, in particular by distillation, and recycled. Organic and aqueous solvents are prepared in particular by fractionated distillation and subsequent condensation. Separation and recycling can be integrated into a fully-automatic cleaner. One advantage is the reduction of costs. In addition, solvent that is already heated is available, which solvent accelerates the cleaning process and/or the (partial) dissolving process. As an alternative, solvents can be cleaned using additional solvents by cleaning methods such as, e.g., rectification, filtration, centrifugal cleaning, adsorption, etc.

In another advantageous embodiment of the invention, it is provided that the solvent for cleaning the substrate stack and/or the product substrate after complete detaching (debonding) is pumped in a circuit and in a further development—exits through nozzles that are arranged in a nozzle body over the in particular entire substrate surface. This can also in particular take place in a separate station or module. In another embodiment, it is provided that the nozzles are arranged over a partial surface of the substrate surface Thus, in particular, a cleaning triangle can form. Because of the pie-shaped configuration of the nozzle body, a uniform distribution of the solvent over the substrate surface can be achieved during rotation of the substrate or substrate stack. The receiving system is put into rotation in this additional embodiment according to the invention by a motor (not shown). A very frequently used type of attachment of the substrate to the receiving system is carried out using vacuum or negative pressure. The substrate-receiving system has vacuum strips on the entire surface or in defined zones of the surface, e.g., the outer zones of the surface. The negative-pressure channel advantageously runs in a concentric, in particular circular, manner to a center Z of the receiving system, in particular tilling it completely. In this respect, a uniform attachment is achieved. In addition, if necessary, the contour of the receiving surface can be set-back relative to the receiving plane of the receiving surface so that recesses are formed that reduce or alter the support surface. If necessary, the receiving surface of the receiving system can be reduced, so that a smaller contact surface is created between substrate and specimen holder. Other possibilities for attaching to the specimen holder are the mechanical attachment by clamping or an electrostatic attachment. Also, specimen holders with pins are used. Special adhesives can also be used. The number and distribution of nozzles in the nozzle body influences the quality and homogeneity of the cleaning, Preferably, more than one nozzle, more preferably more than 5 nozzles, most preferably more than 10 nozzles, and with utmost preference more than 50 nozzles are used. The spraying distance between nozzle and substrate surface is preferably between 0.1 to 100 mm, more preferably between 0.1 to 50 mm, and most preferably between 0.2 to 20 mm. The spray angle and the spray widths can vary depending on the type of nozzle and the spraying distance.

The solvent is pumped into the circuit in the solvent line or in the Common Rail in particular for rough cleaning. The solvent goes through supply lines into the nozzle body. Preferably, 1 to 60, more preferably 1 to 20, most preferably 1 to 10, and with utmost preference 1 to 6 supply lines are used. The rings that are stacked one above the other are arranged in particular in a closed chamber, and the lowermost ring is used in a preferred embodiment for cleaning the substrate stack. If the ring is used for cleaning the product substrate after the detaching, the product substrate is stretched in particular on an adhesive film, preferably with a film frame, and can be cleaned in a cleaning module with a cleaning ring. The cleaning time can be considerably shortened with this cleaning ring. The diameter of the nozzles for the cleaning step is in particular 0.1 to 5 mm, preferably 0.2 to 1 mm. The cleaning can be performed in the same module and/or in a separate station. Multiple cleaning steps can also be performed in the overall process. In another embodiment, the cleaning ring can be rotated, if necessary.

Additional advantages, features and details of the invention follow from the subsequent description of preferred embodiments as well as based on the drawings.

BRIEF DESCRIPTION OF THE DRAWINGS

FIG. 1a: a diagrammatic top view of a device according to the invention in accordance with a first embodiment with a line of intersection A-A, FIG. 1b: a diagrammatic cross-sectional view of a partial section of the device of FIG. 1a along the line of intersection A-A, FIG. 1c: a diagrammatic cross-sectional view of a device according to the invention in accordance with a second embodiment, FIG. 2a: a cross-sectional view of a device according to the invention in accordance with a third embodiment, FIG. 2b: a top view of a receiving system according to a preferred embodiment, FIG. 4a: a cross-sectional view of a receiving system according to another embodiment, FIG. 4b: a top view of the receiving system of FIG. 4a, FIG. 5a: a diagrammatic top view of an exemplary embodiment of a nozzle body.

In the figures, the same components and components with the same function are identified with the same reference numbers and are therefore also only named once in each case.

DETAILED DESCRIPTION OF THE INVENTION

Figure 3:
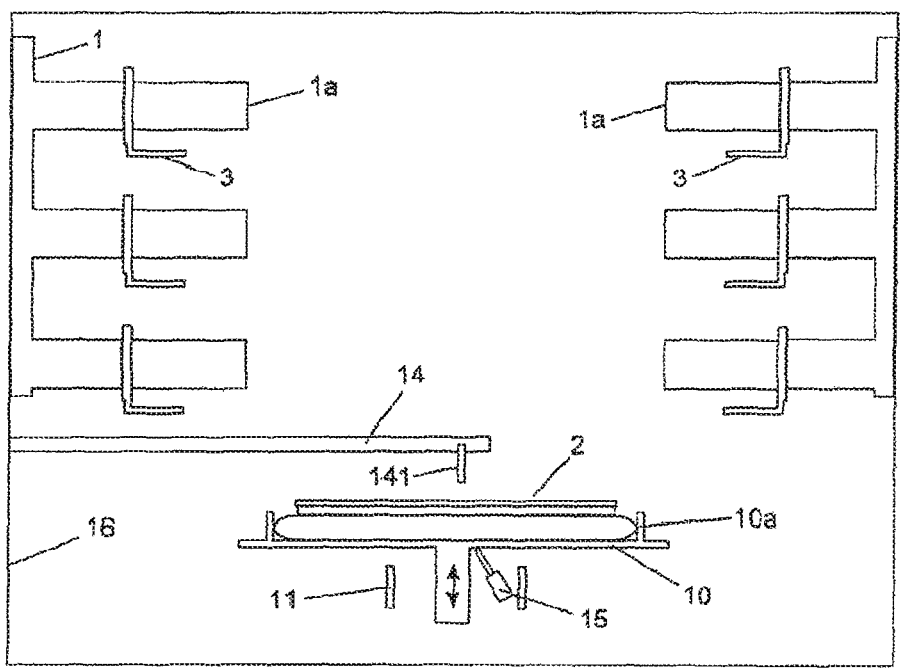
FIG. 3: a cross-sectional view of a device according to the invention in accordance with a fourth embodiment.

FIG. 1a diagrammatically shows a top view of a device 22 according to the invention in accordance with a first embodiment with a line of intersection A-A. FIG. 1b shows a diagrammatic half of a cross-sectional view of the device 22 along the line of intersection A-A. The other half is designed in mirror image.

As shown in the embodiment according to FIGS. 1a and 1b, the device 22 has a ring 1. The ring 1 is equipped with pivoting holding devices 3 with attaching pins 7 in order to hold a substrate stack 2 in a partial-dissolving position. The attaching pins 7 are advantageously cylindrical or have slightly conical tips, but they can also have other suitable shapes and/or sizes. The substrate stack 2 is comprised of a carrier substrate 5 and a product substrate 6, which are temporarily bonded with one another via a connecting layer e.g., an adhesive layer.

The ring 1 is mounted preferably 0.1 to 15 mm, more preferably 0.1 to 10 mm, most preferably 0.1 to 8 mm, and with utmost preference 0.1 to 5 mm away from the substrate stack 2.

The ring 1 is equipped with a solvent line 9 (also called a Common Rail 9 below), in which holes, preferably nozzles 1a, run. The holes, preferably nozzles 1a, have a diameter of preferably 0.01 to 10 mm, more preferably 0.01 to 7 mm, most preferably 0.01 to 5 mm, and with utmost preference 0.1 to 2 mm. The nozzles 1a are arranged on the entire periphery of the ring 1. The distance of the nozzles 1a to one another depends on the material and the edge zone that is to be detached (also called edge area or edge zone below) and lies in a range of 1 to 50 mm, preferably in a range of 3 to 20 mm. The nozzle 1a sprays solvent on the edge area of the connecting layer 4 (indicated with a solvent jet 8).

The diameter of the product substrate 6 is preferably essentially identical to the diameter of the carrier substrate 5. The thickness of the product substrate 6 is in particular smaller than the thickness of the carrier substrate 5.

The solvent lines 9 are filled with solvent, and the solvent exits at high pressure from the nozzles 1a. The pressure in this case is greater than or equal to 1 bar, preferably greater than 5 bar, even more preferably greater than 10 bar, and most preferably greater than 20 bar. If the unit is operated under vacuum and the ambient pressure is less than 1 bar, the pressure of the solvent if necessary can also be less than 1 bar. The pressure of the solvent, however, must in any case be greater than the ambient pressure. The solvent is pumped in the circuit (not shown) and roughly filtered in order to prevent the nozzles 1a from clogging. For an embodiment according to the invention, in which the solvent is separated by distillation and recycled, the solvent is already heated.

The process time, e.g., during the partial-dissolving process (Edge Zone Release (EZR) process) depends on the material, i.e., on adhesive, and on the width of the (adhesive) edge zone. The edge zone can be configured as narrow as possible in order to reduce the process time or the partial-dissolving time.

In an alternative embodiment to FIG. 1b, the ring 1 and/or the holding device 3' is/are designed to rotate. As a holding device 3', i.e., receiving system, in particular a specimen holder (chuck) is suitable. In order to make possible a complete and/or faster loosening or partial dissolving, a relative rotation between the nozzles 1a and the substrate stack 2 is carried out. The substrate stack holding device 3' is preferably located on a shaft that can be put in rotation around its axis. In this embodiment, the holding device 3' is not pivoting but rather runs centrically with a shaft (not shown). Advantageously, the receiving system 10 is installed (see FIG. 2a). The receiving system 10 first moves, in particular is driven over a shaft 12, upward in the z-direction and brings the substrate stack 2 into the operating position.

This shaft can then also be put in rotation around its axis (not shown). Instead of rotation, an oscillation of the holding device 3' around the shaft is also possible. In this case, rotation or oscillation can be set in such a way that at least the angle that lies between two nozzles 1a is covered by the oscillation. As a result, the entire connecting layer periphery is covered, and fewer nozzles 1a can be installed.

FIG. 1c shows one half of a diagrammatic cross-sectional view of a device 22 according to the invention in accordance with a second embodiment. The other half is designed in mirror image. In FIG. 1c, three rings 1 that are in particular designed identically as well as corresponding holding devices 3 are arranged vertically stacked one above the other. All rings 1 are installed in a closed chamber (not shown). The stacked rings 1 are connected to one another and are supplied by means of connecting lines or supply lines 9 with solvent by means of a high-power circulating pump.

Multiple rings 1 can be arranged one above the other in any number, preferably 2 to 30, more preferably 2 to 15, most preferably 2 to 10, and with utmost preference 2 to 5 rings 1, so that multiple substrate stacks 2 can be treated at the same time.

FIG. 2a diagrammatically shows a cross-sectional view of a device 22 according to the invention in accordance with a third embodiment. The device 22 can be designed as described in FIG. 1c, whereby the device 22 in addition has a receiving system 10. The upper ring 1 is already loaded with a substrate stack 2 in this depiction. A second substrate stack is located on the receiving system 10.

The substrate stack 2 may have been previously loaded by a robot (not shown) onto the receiving system (in particular a chuck) 10. The receiving system 10 is designed in such a way that the robot can remove the substrate stack 2 again after the loosening or partial dissolving. The substrate stack 2 is advantageously attached to the receiving system 10 that can move parallel to the z-direction (vertical direction). The receiving system 10 moves, in particular is driven over a shaft 12, upward in the z-direction and brings the substrate stack 2 into the vicinity of the middle holding device 3. After that, movable loading pins 11 load the substrate stack 2 onto the middle holding device 3.

In an advantageous embodiment of the invention, it is provided that the holding devices 3 can be pivoted, and the loading pins 11 can place the substrate stack 2 thereon. The attaching pins 7 prevent the substrate stack 2 from slipping on the holding device 3. In another exemplary embodiment, a vacuum system is arranged alternatively or optionally on the in particular pivoting holding devices 3.

This process is repeated until all substrate stacks 2 are loaded or all rings 1 are loaded. After that, the spraying of the solvent from the nozzles 1a is started.

FIG. 2b shows a top view of a receiving system 10 of a preferred embodiment. To receive a substrate stack 2 from the holding device 3 or to place it on the holding device 3, the receiving system 10 has a lifting mechanism, not shown, with loading pins 11. The lifting mechanism can be integrated into, e.g., the receiving system 10 and can be operated by means of a control network. The receiving system 10 as shown in FIG. 2b has three recesses 13 for loading pins 11. In addition, according to an exemplary embodiment, the support surface of the receiving system 10 has circular recesses that are arranged concentric to the center. These recesses are advantageous in order to be able to perform a cleaning of the substrate stack 2 from below. The recesses can also have other suitable shapes, e.g., can be designed in the shape of a honeycomb or circle and/or have other types of area coverage.

After the spraying process, the lowermost substrate stack 2 is raised by the loading pins 11. After that, the holding devices 3 are pivoted out, and the loading pins 11 place the substrate stack 2 on the receiving system 10. The receiving system 10 moves into a defined lower position in order to make possible or to perform the cleaning of the substrate stack 2.

FIG. 3 diagrammatically shows a cross-sectional view of a device 22 according to the invention in accordance with a fourth embodiment. FIG. 3 shows an embodiment in which the substrate stack 2 is cleaned with solvent, e.g., pure solvent or a solvent mixture, and is dried with fast-drying solvents. The receiving system 10 runs in a defined lower position in order to make possible or to perform the cleaning of the substrate stack 2. The rings 1 that are stacked one above the other as well as the receiving system 10 are arranged in a closed chamber 16.

Above this lower position, there is located a pivoting arm 14 with a nozzle 141 for the cleaning of the substrate stack by solvent. The use of a pivoting shield (not shown) in the device 22 is especially preferred so that when the loosening or partial dissolving is completed, and the lowermost substrate stack 2 is removed for cleaning, the shield prevents the contamination of the lowermost substrate stack 2 by drops from above. If the shield pivots, the substrate stack 2 can be cleaned and then dried. For receiving the next substrate stack 2, the shield comes up again.

Advantageously, it is provided to extract the lowermost substrate stack 2 in each case downward from the ring stack with the receiving system 10 that is movable in the z-direction and to cover it with the pivoting shield to the extent that cleaning and drying with solvent are possible. The pivoting arm 14 with the nozzle 141 is used for the cleaning of the upper side of the substrate stack 2. Under the receiving system 10, there is located another nozzle 15 that points in the direction toward the center of the substrate stack 2, so that even the lower side of the substrate stack 2 can be cleaned. In this exemplary embodiment, the substrate stack 2 is secured only on the periphery of three attaching pins 10a during the cleaning step.

The substrate stack 2 is unloaded from the receiving system 10 with a robot and runs, e.g., onto a film-frame mounter or to the next module (e.g., for Edge Zone Debonding EZD). As an alternative, e.g., a buffer station is used for intermediate storage of the substrate stack 2, before the latter is further processed in the process, i.e., e.g., until there are again spaces for further processing in the in particular automatic unit.

FIG. 4a diagrammatically shows another exemplary embodiment of the receiving system 10 in a side view. FIG. 4b shows a top view of the receiving system 10, movable in the z-direction, from FIG. 4a. The substrate stack 2 (not shown) is secured only on the periphery with three attaching pins 10a. The receiving system 10 has three longitudinal arms 101, which extend radially outward from the center of the receiving system 10 and are evenly spaced at intervals of 120°. The ends of the arms 101 lie on a circle K. The arms 101 are made the same length. The arms 101 are designed to be rod-shaped with uniform cross-sections. A horizontally-arranged support surface for the substrate stack 2 is arranged on the radially outward-lying ends of the arms 101. The attaching pin 10a is located on this support surface. This embodiment makes possible an especially efficient cleaning of the substrate stack 2. The contour of the support surface and the shape of the receiving system 10 are not, moreover, limited to the embodiments according to FIG. 2b and FIG. 4b.

Figure 5A:
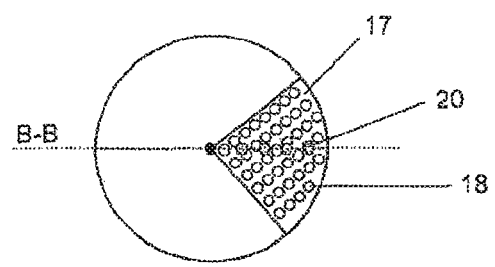
FIG. 5b: a cross-sectional view of another exemplary nozzle body.
Figure 5B:
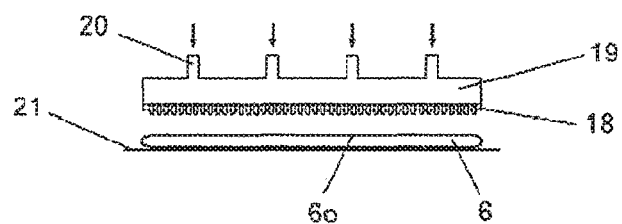

FIGS. 5a and 5b show nozzle bodies 17, 19 according to two further developments of the device 22 according to the invention. The nozzle bodies 17, 19 can be arranged above the product substrate 6 with the substrate surface 6o. As a result, the product substrate 6 can be especially efficiently cleaned, in particular from above, in particular after the substrate stack 2 has been completely separated.

According to a first embodiment, FIG. 5a shows a nozzle body 17 (with a so-called cleaning triangle), whose nozzles 18 are arranged only on a partial area of the nozzle body 17 or the surface of the nozzle body 17. This partial area comprises in particular a circular surface segment that extends from the center over an angle of approximately 900. The nozzle body 17 and/or the product substrate 6 can be rotated in particular in order to achieve an especially thorough cleaning of the surface 6o0.

FIG. 5b shows a nozzle body 19 according to a second embodiment, whose nozzles 18 are arranged distributed not only over a partial area but over the entire surface of the nozzle body 19. The nozzle body 19 is equipped with the nozzles 18 on the entire surface.

The solvent or solvent mixture is pumped into the circuit in particular for the rough cleaning in the Common Rail 9. The solvent is pumped through supply lines 20 into the nozzle body 17 or 19.

The device 22 has the nozzle body 17 or 19 in particular for cleaning the product substrate 6 after the detaching (Edge Zone Debonding EZD). The product substrate 6 is in particular stretched on an adhesive film 21 with a film frame and is cleaned in particular in a separate cleaning module.

LIST OF REFERENCE SYMBOLS

1 Ring
1a Nozzle
2 Substrate stack
3, 3' Holding device
4 Connecting layer
5 Carrier substrate
6 Product substrate
6o Substrate surface
7 Attaching pin
8 Solvent jet
9 Solvent line
10 Receiving system
10a Attaching pin
101 Arm
11 Loading pin
12 Shaft
13 Recess
14 Arm
141 Nozzle
15 Nozzle
16 Chamber
17 Nozzle body
18 Nozzle
19 Nozzle body
20 Supply line
21 Film
K Circle Having described the invention, the following is claimed:
1. A device for at least partial loosening of a connecting layer of a temporarily bonded substrate stack, the substrate stack having at least two substrates that are temporarily bonded to each other with the connecting layer, the device comprising:
a plurality of rings arranged one next to the other and vertically one above the other, each of said rings having an inner circumference and being equipped with a plurality of holding chucks extending inward from said inner circumference, said holding chucks being configured to receive and hold the substrate stack; and
a plurality of nozzles arranged at least over a portion of a periphery of each of the rings, each of the nozzles being directed toward the connecting layer of the substrate stack, each of the nozzles being configured to spray a solvent onto an edge area of the connecting layer.

2. The device according to claim 1, wherein each of the nozzles has a diameter of 0.01 to 10 mm.

3. The device according to claim 1, wherein each of the rings is equipped with a solvent line that is connected to the nozzles of the ring.

4. The device according to claim 1, wherein the nozzles of each ring are spaced from one another over an entire periphery of the ring.

5. The device according to claim 4, wherein the nozzles of each ring are evenly spaced from one another over the entire periphery of the ring.

6. The device according to claim 1, wherein each of said rings has at least 60 of said nozzles.

7. The device according to claim 1, wherein the holding chucks pivot.

8. The device according to claim 1, wherein each of the holding chucks have at least one attaching pin for fastening the substrate stack thereto.

9. The device according to claim 1, wherein the rings are installed in a closed chamber.

10. The device according to claim 1, wherein the device has 2 to 30 of said rings arranged one above the other.

11. The device according to claim 1, wherein the nozzles of each ring pivot with a degree of pivoting movement of 1° to 20°.

12. The device according to claim 11, wherein the nozzles of each ring pivot in a horizontal plane.

13. The device according to claim 1, further comprising:
a receiving system configured to transport the substrate stack to and/or away from each of said rings, said receiving system being further configured to move in a vertical direction.

14. A device for at least partial loosening of a connecting layer of a temporarily bonded substrate stack, the substrate stack having at least two substrates that are temporarily bonded to each other with the connecting layer, the device comprising:
a plurality of rings arranged one next to the other and vertically one above the other, an inside of each of said rings being dimensioned to receive the substrate stack; and
a plurality of nozzles arranged at least over a portion of a periphery of each of the rings, each of the nozzles being directed toward the connecting layer of the substrate stack, each of the nozzles being configured to spray a solvent onto an edge area of the connecting layer;
a receiving system configured to transport the substrate stack to and/or away from each of said rings, said receiving system being further configured to move in a vertical direction; and
one or more additional nozzles configured to clean a bottom of the substrate stack, said additional nozzles being located below the receiving system and/or in a lowermost ring, said additional nozzles pointing toward a direction of a center of the substrate stack.

15. The device according to claim 14, wherein the device has 1 to 60 of said additional nozzles.

16. The device according to claim 14, further comprising:
a plurality of attaching pins configured to secure the substrate stack during cleaning of the substrate stack.

17. The device according to claim 16, wherein the device has 15 or less attaching pins.

18. A device for at least partial loosening of a connecting layer of a temporarily bonded substrate stack, the substrate stack having at least two substrates that are temporarily bonded to each other with the connecting layer, the device comprising:
a plurality of rings arranged one next to the other and vertically one above the other, an inside of each of said rings being dimensioned to receive the substrate stack;
a plurality of nozzles arranged at least over a portion of a periphery of each of the rings, each of the nozzles being directed toward the connecting layer of the substrate stack, each of the nozzles being configured to spray a solvent onto an edge area of the connecting layer; and
a pivoting arm with at least one nozzle for cleaning the substrate stack.

19. A method for at least partial loosening of a connecting layer of a temporarily bonded substrate stack, said substrate stack comprised of at least two substrates temporarily bonded to each other with the connecting layer, the method comprising:
placing the substrate stack inside a ring of a device comprised of a plurality of rings arranged one next to the other, each ring having a plurality of nozzles that are arranged at least over a portion of a periphery of the ring, wherein each of said nozzles receives a solvent;
directing the nozzles toward the connecting layer; and
spraying the solvent onto an edge area of the connecting layer.

* * * * *